United States Patent
Osada et al.

(10) Patent No.: US 8,532,309 B2
(45) Date of Patent: Sep. 10, 2013

(54) SIGNAL CORRECTION APPARATUS AND SIGNAL CORRECTION METHOD

(75) Inventors: Masataka Osada, Kawasaki (JP); Takashi Sudo, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 329 days.

(21) Appl. No.: 13/090,182

(22) Filed: Apr. 19, 2011

(65) Prior Publication Data

US 2011/0255699 A1 Oct. 20, 2011

(30) Foreign Application Priority Data

Apr. 19, 2010 (JP) ................................ 2010-096267

(51) Int. Cl.
*H04R 29/00* (2006.01)
*H04B 3/00* (2006.01)

(52) U.S. Cl.
USPC ............................................. 381/56; 381/80

(58) Field of Classification Search
USPC .................. 381/56, 80, 98, 71.14, 94.1–94.3; 700/94
See application file for complete search history.

(56) References Cited

U.S. PATENT DOCUMENTS

| 6,973,184 B1 * | 12/2005 | Shaffer et al. ............ 379/420.01 |
| 2004/0019481 A1 | 1/2004 | Saito | |

FOREIGN PATENT DOCUMENTS

| JP | 06-149292 | 5/1994 |
| JP | 07-013586 | 1/1995 |
| JP | 2004-046179 | 2/2004 |
| JP | 2004-061617 A2 | 2/2004 |
| JP | 2007-081560 | 3/2007 |
| JP | 2010-136236 | 6/2010 |
| JP | 2011-081033 | 4/2011 |
| WO | WO 98/46045 | 10/1998 |

OTHER PUBLICATIONS

Office Action mailed in corresponding Japanese Application No. JP 2010-096267 on Sep. 6, 2011.

* cited by examiner

*Primary Examiner* — Vivian Chin
*Assistant Examiner* — Ammar Hamid
(74) *Attorney, Agent, or Firm* — Knobbe Martens Olson & Bear LLP

(57) ABSTRACT

According to one embodiment, a signal correction apparatus includes a sound quality estimation module, a sound quality enhancement processing controller, and a sound quality enhancement processor. The sound quality estimation module is configured to generate channel importance information based on correlations of channels for signals input from one or more channels, and to generate frequency importance information based on noise levels. The sound quality enhancement processing controller is configured to decide valid channels and valid frequency components which are to undergo sound quality enhancement processing of the signals based on the channel importance information and the frequency importance information, and to generate valid channel information and valid processing frequency information. The sound quality enhancement processor is configured to apply sound quality enhancement processing to signals of the valid channels and the valid frequency components based on the valid channel information and the valid processing frequency information.

12 Claims, 4 Drawing Sheets

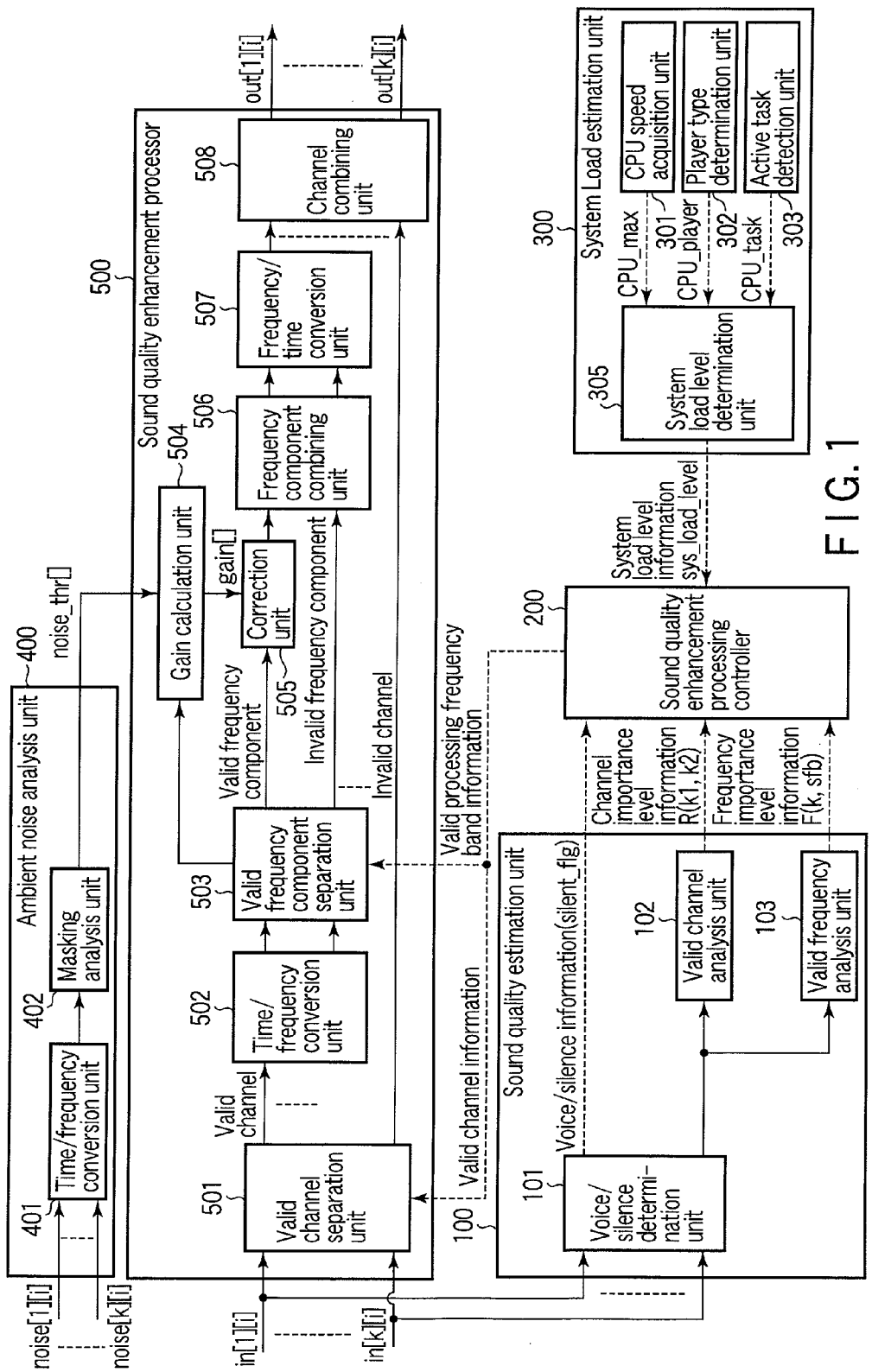
F I G. 1

Table for explaining channel correlations and channel importance level information in sound quality estimation unit

| Range of cross-correlation Cross_Cor | Channel importance level information |
|---|---|
| Cross_Cor<0 | 5 |
| 0≦Cross_Cor<0.3 | 4 |
| 0.3≦Cross_cor<0.5 | 3 |
| 0.5≦Cross_Cor<0.7 | 2 |
| 0.7≦Cross_Cor<1 | 1 |
| Cross_cor=1 | 0 |

F I G. 2

Table showing scale factor bands and band boundaries

| Sfb | Sfb_idx | sfb | sfb_idx |
|---|---|---|---|
| 0 | 0 | 25 | 216 |
| 1 | 4 | 26 | 240 |
| 2 | 8 | 27 | 264 |
| 3 | 12 | 28 | 292 |
| 4 | 16 | 29 | 320 |
| 5 | 20 | 30 | 352 |
| 6 | 24 | 31 | 384 |
| 7 | 28 | 32 | 416 |
| 8 | 32 | 33 | 448 |
| 9 | 36 | 34 | 480 |
| 10 | 40 | 35 | 512 |
| 11 | 48 | 36 | 544 |
| 12 | 56 | 37 | 576 |
| 13 | 64 | 38 | 608 |
| 14 | 72 | 39 | 640 |
| 15 | 80 | 40 | 672 |
| 16 | 88 | 41 | 704 |
| 17 | 96 | 42 | 736 |
| 18 | 108 | 43 | 768 |
| 19 | 120 | 44 | 800 |
| 20 | 132 | 45 | 832 |
| 21 | 144 | 46 | 864 |
| 22 | 160 | 47 | 896 |
| 23 | 176 | 48 | 928 |
| 24 | 196 | | 1024 |

F I G. 3

Table for explaining sfm and frequency importance level information in sound quality estimation unit

| Range of spectral flatness measure sfm | Frequency importance level information |
|---|---|
| $0 \leq sfm < 0.1$ | 5 |
| $0.1 \leq sfm < 0.3$ | 4 |
| $0.3 \leq sfm < 0.5$ | 3 |
| $0.5 \leq sfm < 0.7$ | 2 |
| $0.7 \leq sfm \leq 1$ | 1 |

F I G. 4

Table for explaining relationship between CPU_available and sys_load_level

| Range of available CPU resource CPU_available (MHz) | System load level (sys_load_level) |
|---|---|
| $0 \leq CPU\_available < 50$ | 5 |
| $50 \leq CPU\_available < 100$ | 4 |
| $100 \leq CPU\_available < 200$ | 3 |
| $200 \leq CPU\_available < 500$ | 2 |
| $500 \leq CPU\_available \leq 1000$ | 1 |

F I G. 5

Table for explaining relationship between system load level, channel importance level information, and frequency importance level information

| sys_load_level | Channel importance level information to be handled as valid channel | Frequency importance level information to be handled as valid frequency band |
|---|---|---|
| 1 | 1, 2, 3, 4, 5 | 1, 2, 3, 4, 5 |
| 2 | 2, 3, 4, 5 | 2, 3, 4, 5 |
| 3 | 3, 4, 5 | 3, 4, 5 |
| 4 | 4, 5 | 4, 5 |
| 5 | 5 | 5 |

F I G. 6

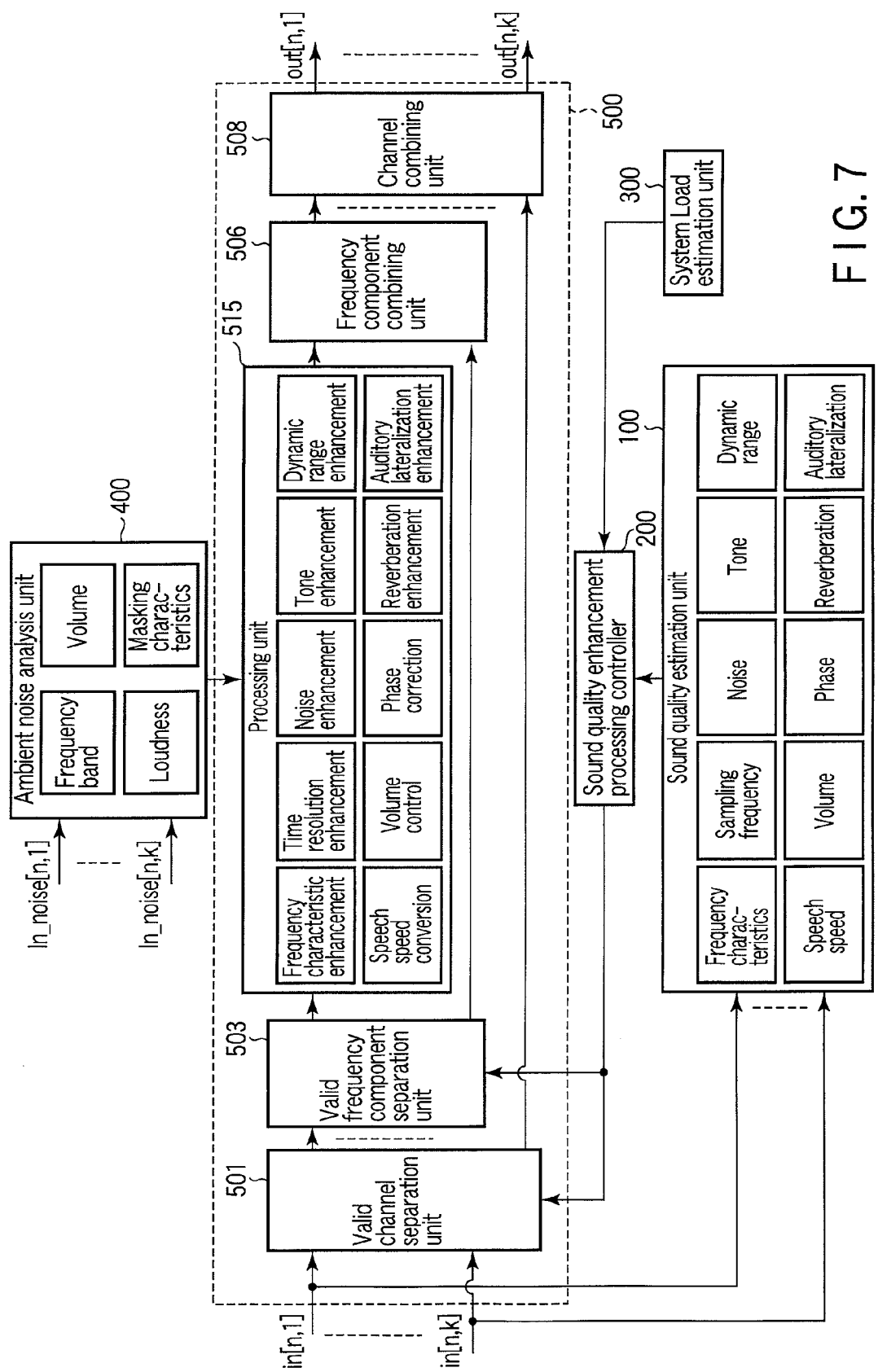
F I G. 7

SIGNAL CORRECTION APPARATUS AND SIGNAL CORRECTION METHOD

CROSS-REFERENCE TO RELATED APPLICATIONS

This application is based upon and claims the benefit of priority from Japanese Patent Application No. 2010-096267, filed Apr. 19, 2010; the entire contents of which are incorporated herein by reference.

FIELD

Embodiments described herein relate generally to a signal correction apparatus and a signal correction method which apply correction processing to a signal.

BACKGROUND

Currently, cellular phones are the prevailing means of voice telecommunication. Since mobile phones are frequently used outdoors, for example, ambient noise such as traffic noise often disturbs listening during voice communication. Because of this, output voice clarity enhancement techniques have recently been proposed.

As an output voice clarity enhancement technique, for example, Jpn. Pat. Appln. KOKAI Publication No. 2004-61617 discloses the following technique.

That is, Jpn. Pat. Appln. KOKAI Publication No. 2004-61617 discloses a received voice processing apparatus characterized by comprising a voice frequency analysis unit which calculates a voice spectrum by frequency-analyzing a received voice signal, a target spectrum calculation unit which calculates a target spectrum based on compression ratios for the voice spectrum, which ratios are set for respective frequency bands, a gain calculation unit which calculates, for respective frequency bands, gain values required to amplify the voice spectrum to the target spectrum, a filter coefficient calculation unit which calculates filter coefficients of filter processing for the received voice signal based on the gain values for respective frequency bands, and a filter unit which is set with the filter coefficients and applies filter processing to the received voice signal.

The technique disclosed in Jpn. Pat. Appln. KOKAI Publication No. 2004-61617 aims at enhancing voice clarity after sound quality deterioration and changes are eliminated without greatly changing the volume of a reproduced voice.

Meanwhile, the opportunity to use content on the Internet (generally called net content) has increased rapidly in recent years. Net content has a wide variety of qualities (source qualities). This is because the quality of net content depends on various factors such as recording environment (creation environment) on the side of content creators, codec parameters upon uploading the net content to servers, and viewing environments (for example, transmission rates and viewing modes) on the side of viewers.

Although the net content has a wide variety of (nonuniform) qualities, since conventional techniques represented by that disclosed in Jpn. Pat. Appln. KOKAI Publication No. 2004-61617 do not assume content having a wide variety of qualities as clarity enhancement processing targets (since they assume only received voices having roughly uniform qualities), various problems are caused.

Emphasis of low-quality sources mostly included in the net content results in further quality deterioration, and excessive correction processing results in an increase in processing volume. Upon execution of clarity enhancement processing, processing is switched depending on changes in ambient noise. However, since processing loads by other applications which run on a system are not taken into consideration, an allowable processing volume of the system is consequently exceeded.

In consideration of these problems and future circumstances of further frequent use opportunities of net content, clarity enhancement processing that assumes playback of content having a wide variety of qualities like net content is demanded.

The present invention has been made in consideration of the above situation, and has as its object to provide a signal correction apparatus which can apply optimal correction processing to content having a wide variety of qualities according to each individual content quality.

According to the present invention, a signal correction apparatus which can apply optimal correction processing to content having a wide variety of qualities according to each individual content quality can be provided.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 1 is an exemplary block diagram showing an example of the arrangement of a signal correction apparatus according to an embodiment of the present invention;

FIG. 2 shows an example of a table which associates cross-correlation Cross_Cor values calculated by a sound quality estimation module with channel importance level information;

FIG. 3 shows an example of a table showing the correspondence relationship between sfb and sfb band boundaries;

FIG. 4 shows an example of a table which associates spectral sfm with frequency importance level information;

FIG. 5 shows an example of a table for explaining the relationship between CPU resource CPU_available values and system load levels sys_load_level;

FIG. 6 shows an example of a table which associates system load level information sys_load_level, channel importance level information to be handled as valid channels, and frequency importance level information to be handled as valid frequency bands with each other; and FIG. 7 is an exemplary schematic block diagram showing an example of the arrangement of a signal correction apparatus according to a modification of the embodiment.

DETAILED DESCRIPTION

Various embodiments will be described hereinafter with reference to the accompanying drawings.

In general, according to one embodiment, a signal correction apparatus includes a sound quality estimation module, sound quality enhancement processing controller, and sound quality enhancement processor. The sound quality estimation module is configured to execute sound quality estimation for signals input from one or more channels, and to generate channel importance level information indicating importance levels of channels and frequency importance level information indicating importance levels of frequencies based on the sound quality estimation result. The sound quality enhancement processing controller is configured to decide valid channels and valid frequency components which are to undergo sound quality enhancement processing of the signals based on the channel importance level information and the frequency importance level information, and to generate valid channel information and valid processing frequency information based on the decision result. The sound quality enhancement processor is configured to apply sound quality enhancement processing to only signals of the valid channels and the valid frequency components based on the valid channel information and the valid processing frequency information.

An embodiment of the present invention will be described hereinafter with reference to the drawings.

FIG. 1 is a block diagram showing an example of the arrangement of a signal correction apparatus according to an embodiment of the present invention. A case will be exemplified below wherein the signal correction apparatus according to this embodiment is applied to a mobile phone. However, the signal correction apparatus according to this embodiment is not limited to a mobile phone but it is also applicable to any other apparatuses such as PCs, game machines, and music players as long as they can correct an input sound and can output the corrected sound.

The mobile phone to which the signal correction apparatus according to this embodiment is applied has a control module which includes, for example, a CPU, ROM, and RAM, and controls the overall mobile phone, a wireless communication module which exchanges wireless signals with a base station via an antenna, a microphone which receives, for example, voice and ambient noise, a loudspeaker which outputs sound, and a display which displays characters and images.

As shown in FIG. 1, the signal correction apparatus according to this embodiment includes a sound quality estimation module 100, sound quality enhancement processing controller 200, system load estimation module 300, ambient noise analysis module 400, and sound quality enhancement processor 500.

Input signals in[k][i] ("k" indicates an input channel, and "i" indicates a PCM sample number) input to the signal correction apparatus according to this embodiment are input to the sound quality estimation module 100 and sound quality enhancement processor 500. Note that the input signal means an audio signal associated with content (for example, net content acquired by the wireless communication module, or broadcast content received via a broadcast signal) which are being viewed by the user.

The sound quality estimation module 100 has a voice/silence determination module 101, valid channel analysis module 102, and valid frequency analysis module 103.

The voice/silence determination module 101 calculates powers P[k] of the input signals in[k][i] input from a plurality of input channels by:

$$P[k] = \frac{1}{N}\sum_{i=0}^{N-1} in[k][i] \times in[k][i] \quad (1)$$

where N is a frame size.

The voice/silence determination module 101 compares a power P[n, k] value and a given threshold SILENT_TH based on the calculation result using equation (1), and checks based on the comparison result whether an input signal in[n, k] is a voice or silence signal.

More specifically, when the power P[n, k] value is less than or equal to the threshold SILENT_TH, the voice/silence determination module 101 determines that the input signal in[n, k] is a silence signal. On the other hand, when the power P[n, k] value exceeds the threshold SILENT_TH, the voice/silence determination module 101 determines that the input signal in[n, k] is a voice signal.

When the voice/silence determination module 101 determines that the input signal in[n, k] is a silence signal, it sets a voice/silence flag silent_flg=1. On the other hand, when the voice/silence determination module 101 determines that the input signal in[n, k] is a voice signal, it sets a voice/silence flag silent_flg=0. The voice/silence determination module 101 sends the voice/silence flags silent_flg, which are set in this way, to the sound quality enhancement processing controller 200 as voice/silence information.

Also, the input signals in[k][i] input to the sound quality estimation module 100 are input to the valid channel analysis module 102 and valid frequency analysis module 103 via the voice/silence determination module 101.

The valid channel analysis module 102 sets importance levels (channel importance level information) based on correlations of channels of the input signals. For this purpose, the valid channel analysis module 102 executes correlation analysis between channels for the input signals in[k][i]. More specifically, for example, when the input signals are stereo signals, the valid channel analysis module 102 calculates a cross-correlation Cross_Cor between a right channel signal in[1][i] and left channel signal in[2][i] by:

$$\text{Cross\_Cor} = \frac{1}{N}\sum_{i=0}^{N-1} in[1][i] \cdot in[2][i] \quad (2)$$

The valid channel analysis module 102 then sets channel importance level information to set a lower importance level as channel correlation increases in accordance with the value of the calculated cross-correlation Cross_Cor. FIG. 2 shows an example of a table which associates the cross-correlation values with the channel importance level information. This channel importance level information is referred to upon execution of sound quality enhancement processing (to be described later). Note that the table which associates the cross-correlation Cross_Cor values with the channel importance level information is not limited to the example shown in FIG. 2.

The valid channel analysis module 102, which sets the channel importance level information, sends the channel importance level information and channel numbers to the sound quality enhancement processing controller 200. More specifically, the valid channel analysis module 102 sends the channel importance level information and channel numbers to the sound quality enhancement processing controller 200. That is, letting R be channel importance level information and k1 and k2 be correlated channel numbers, the valid channel analysis module 102 sends R(k1, k2) to the sound quality enhancement processing controller 200.

Note that as the method of calculating a correlation between channels, a method other than the aforementioned cross-correlation method, for example, a method of deciding a correlation based on a ratio of a sum signal and difference signal of the right and left channels, may be used, or a general mathematical method may be used.

The valid frequency analysis module 103 sets importance levels (frequency importance level information) according to valid components and noise levels for respective frequency components of the signals.

The valid frequency analysis module 103 analyzes valid components of frequency bands for the input signals in[k][i].

This valid frequency analysis module 103 specifies signal lost bands of the input signals in[k][i].

More specifically, in case of input signals to which an audio codec such as AAC or MP3 is applied, since some high-frequency band components are lost, the valid frequency analysis module 103 specifies the lost bands.

For example, let in_spec_r[k][j] be real number parts of signals obtained by converting the input signals in[k][i] into those of the frequency domain by FFT, and in_spec_i[k][j] be imaginary number parts. Furthermore, a plurality of parts in_spec_r[k][j] and in_spec_i[k][j] are grouped to configure scale factor bands (to be abbreviated as "sfb" hereinafter). Then, by executing power determination for respective sfb, signal lost bands in high-frequency bands are specified.

In this case, sfb band boundaries may be decided using a table described in, for example, ISO/IEC 13818-7, or by other methods. FIG. 3 shows an example of a table showing the correspondence relationship between the sfb and sfb band boundaries. Note that the table showing the correspondence relationship between the sfb and sfb band boundaries is not limited to the example shown in FIG. 3.

An sfb power value is calculated by:

$$\text{sfb\_power}[k][b] = \frac{\sum_{J=\text{sfb\_idx}[b]}^{\text{sfb\_idx}[b+1]} \left( \begin{array}{c} \text{in\_spec\_r}[k][j] \times \text{in\_spec\_r}[k][j] + \\ \text{in\_spec\_i}[k][j] \times \text{in\_spec\_i}[k][j] \end{array} \right)}{\text{sfb\_idx}[b+1] - \text{sfb\_idx}[b]}$$

Then, the valid frequency analysis module 103 compares the sfb power values with a given threshold Freq_TH while decreasing an sfb identifier b in turn from sfb_power[k][SFB_MAX-1] on the high-frequency side toward the low-frequency side. Note that SFB_MAX indicates the number of sfb. In this comparison processing, a value b when sfb_power[k][b]>Freq_TH is satisfied first is saved as upper_sfb. The valid frequency analysis module 103 decides sfb greater than or equal to upper_sfb specified by the aforementioned processing as lost bands caused by the codec. Since it is not required for the user to enhance the clarity for such lost bands, the frequency importance level information for the lost bands is set at a lowest level "0" irrespective of the result of noise determination (to be described below).

Next, the valid frequency analysis module 103 determines noise levels for respective frequency bands. This embodiment will explain an example using spectral flatness measures (to be abbreviated as sfm hereinafter) as that of the noise determination method. An sfm value can be calculated as a measure for measuring spectral flatness by:

$$sfm[b] = \log\left(\frac{Mg}{Ma}\right) \tag{3}$$

for $$Ma = \frac{\sum_{i=\text{sfb\_idx}[b]}^{\text{sfb\_idx}[b+1]-1} \text{sfb\_power}[1][i]}{\text{sfb\_idx}[b+1] - \text{sfb\_idx}[b]}$$

Hence, we have:

$$Mg = \sqrt[n]{\text{sfb\_power}[k][\text{sfb\_idx}[b]] \times \ldots \times \text{sfb\_power}[k][\text{sfb\_idx}[b+1]-1]}$$

In this case, the spectrum is flat with increasing sfm[b] value calculated by equation (3), and a noise level is high. It is considered that a signal having such high noise level has low necessity of clarity enhancement for the user.

Hence, the frequency importance level information is decided to have a lower importance level as the sfm[b] value is larger. FIG. 4 shows an example of a table which associates the sfm with frequency importance level information. Note that for the lost bands discriminated by the valid frequency analysis module 103, the frequency importance level information is set at a lowest level "0" irrespective of the sfm determination result.

The valid frequency analysis module 103 sends the frequency importance level information to the sound quality enhancement processing controller 200 together with channel numbers k and frequency band numbers sfb. That is, letting F be frequency importance level information, k be a channel number, and sfb be a frequency band number, the valid frequency analysis module 103 sends F(k, sfb) to the sound quality enhancement processing controller 200.

The sound quality enhancement processing controller 200 decides valid channels and valid frequency components to be processed by the sound quality enhancement processor 500 based on the voice/silence information silent_flg, channel importance level information R(k1, k2), and frequency importance level information F(k, sfb) sent from the sound quality estimation module 100, and system load level information sys_load_level sent from the system load estimation module 300. Details of the processing by this sound quality enhancement processing controller 200 will be described later.

The system load estimation module 300 estimates (determines) how much processing resources of the CPU included in the mobile phone, which includes the signal correction apparatus according to this embodiment, the processing of the sound quality enhancement processor 500 can occupy.

More specifically, the system load estimation module 300 has a CPU speed acquisition module 301, player type determination module 302, active task detection module 303, and active time acquisition module 304.

The CPU speed acquisition module 301 holds the CPU speed value of the CPU, and sends it as CPU_max (MHz) to a system load level determination module 305. This CPU speed is determined by the CPU included in an apparatus/system which includes the signal correction apparatus according to this embodiment.

Note that when the CPU speed assumes a value which changes dynamically, the CPU speed acquisition module 301 is configured to update the CPU speed value at predetermined time intervals.

The player type determination module 302 acquires a type of a player application used in content playback processing. The player type determination module 302 holds in advance image quality enhancement processing supported by that player application and its processing load.

The player type determination module 302 with this configuration specifies a load CPU_Player (MHz) of image quality enhancement processing by the player application, which runs on the apparatus/system that includes the signal correction apparatus, and sends it to the system load level determination module 305.

Note that when there are other functions supported by the player application in addition to the image quality enhancement processing, the processing loads of these functions may be specified, and may be sent to the system load level determination module 305.

When another task (thread) which is independent from the player application runs on the apparatus/system including the signal correction apparatus, the active task detection module 303 detects a processing load CPU_task (MHz) of that task (thread), and sends it to the system load level determination module 305.

The system load level determination module 305 calculates a CPU resource (MHz) available for the sound quality enhancement processor 500 using:

$$CPU\_available=CPU\_max-CPU\_player-CPU\_task \quad (4)$$

Then, the system load level determination module 305 decides a system load level sys_load_level according to the CPU resource CPU_available value calculated using equation (4), and sends it to the sound quality enhancement processing controller 200.

FIG. 5 shows an example of a table for explaining the relationship between the CPU resource CPU_available values and system load levels sys_load_level. Note that this table can be arbitrarily decided for each system according to the processing of the sound quality enhancement processor 500, and the table shown in FIG. 5 is presented only for exemplary purpose.

The system load level determination module 305 calculates the system load level sys_load_level by comparing the CPU resource CPU_available calculated by the aforementioned processing and the table shown in FIG. 5, and sends it to the sound quality enhancement processing controller 200.

The sound quality enhancement processing controller 200 decides valid channels and valid frequency components to be processed by the sound quality enhancement processor 500 based on the voice/silence information silent_flg, channel importance level information R(k1, k2), and frequency importance level information F(k, sfb) sent from the sound quality estimation module 100 and the system load level information sys_load_level sent from the system load estimation module 300.

Furthermore, the sound quality enhancement processing controller 200 generates valid channel information indicating that the decided valid channels are handled as valid channels, and sends it to a valid channel separation module 501 of the sound quality enhancement processor 500. Also, the sound quality enhancement processing controller 200 generates valid processing frequency band information indicating that the decided valid frequencies are handled as valid frequencies, and sends it to a valid frequency component separation module 503 of the sound quality enhancement processor 500.

More specifically, the sound quality enhancement processing controller 200 executes the following processing.

That is, when the voice/silence information sent from the sound quality estimation module 100 is set to be silent_flg=1, the sound quality enhancement processing controller 200 determines that the input signals in[k][i] are silence signals, generates valid channel information indicating that all channels are invalid channels, and generates valid processing frequency band information indicating that all frequency bands are invalid frequency bands.

On the other hand, when the voice/silence information sent from the sound quality estimation module 100 is set to be silent_flg=0, the sound quality enhancement processing controller 200 determines that the input signals in[k][i] are voice signals, and sets valid channels and valid frequency bands based on the system load level information sys_load_level with reference to a table shown in FIG. 6.

FIG. 6 shows an example of a table which associates the system load level information sys_load_level, channel importance level information to be handled as valid channels, and frequency importance level information to be handled as valid frequency bands with each other.

Note that the table shown in FIG. 6 is an example, and the embodiment is not limited to the example shown in FIG. 6. That is, the table may be arbitrarily specified without departing from the purpose that the number of channels to be handled as valid channels and valid frequency components to be processed are decreased as the system load level increases.

More specifically, in the example shown in FIG. 6, the respective pieces of information are specified as follows.

When the system load level information sys_load_level assumes a value "1", the sound quality enhancement processing controller 200 sets channels corresponding to all pieces of channel importance level information (channel importance level information=1, 2, 3, 4, and 5) as valid channels (sets all channels as valid channels). Likewise, the sound quality enhancement processing controller 200 sets frequency bands corresponding to all pieces of frequency importance level information (frequency importance level information=1, 2, 3, 4, and 5) as valid frequency bands (sets all frequency bands as valid frequency bands). Then, the sound quality enhancement processing controller 200 generates the valid channel information and valid processing frequency band information based on these settings, and sends them to the sound quality enhancement processor 500.

When the system load level information sys_load_level assumes a value "2", the sound quality enhancement processing controller 200 sets only channels corresponding to channel importance level information values=2, 3, 4, and 5 as valid channels. Likewise, the sound quality enhancement processing controller 200 sets only frequency bands corresponding to frequency importance level information values=2, 3, 4, and 5 as valid frequency bands. Then, the sound quality enhancement processing controller 200 generates the valid channel information and valid processing frequency band information based on these settings, and sends them to the sound quality enhancement processor 500.

When the system load level information sys_load_level assumes a value "3", "4", or "5", the sound quality enhancement processing controller 200 similarly sets valid channels and valid frequency bands based on the table shown in FIG. 6 to generate the valid channel information and valid processing frequency band information, and sends them to the sound quality enhancement processor 500.

The ambient noise analysis module 400 includes a time/frequency conversion module 401 and masking analysis module 402. This ambient noise analysis module 400 receives and analyzes noise (for example, ambient noise produced by trains, automobiles, and crowds) in an ambient environment (viewing environment of the user) of the apparatus/system including the signal correction apparatus.

The time/frequency conversion module 401 converts noise [k][i] signals as ambient noise PCM signals received by the microphone into real number parts noise_spec_r[k][j] and imaginary number parts noise_spec_i[k][j] as signals of the frequency domain, and outputs them to the masking analysis module 402.

The masking analysis module 402 calculates masking characteristics for noise_spec_r[k][j] and noise_spec_i[k][j]. In this case, the masking characteristics are calculated by convoluting a function called a spreading function into a signal power. This spreading function is a function having characteristics that simulate an auditory filter, and is described in detail in references such as B. C. J. Moore, "An Introduction to the Psychology of Hearing" (Seishinshobo), ISO/IEC 13818-7, ITU-R1387, and 3GPP TS 26.403. Note that the masking characteristics are a known technical matter, and a detailed description thereof will not be given.

In this case, an example using the ISO/IEC 13818-7 method will be described below. In the ISO/IEC 13818-7 method, the spreading function is defined as follows:

$$tmpz = 8 \times minimum((tmpx-0.5)^2 - 2 \cdot (tmpx-0.5), 0)$$

Where $$\begin{cases} \text{When } b2 \geq b1 & tmpx = 3.0 \cdot (b2 - b1) \\ \text{When } b2 < b1 & tmpx = 1.5 \cdot (b1 - b2) \end{cases}$$

$$tmpy = 15.811389 + 7.5 \cdot (tmpx + 0.474) - 17.5 \cdot (1.0 + (tmpx + 0.474)^2)^{0.5}$$

When tmpy<−100 sprdngf(b1,b2)=0
When tmpy≧−100 sprdngf(b1,b2)=10((tmpz+tmpy)/10)
where sprdngf( ) indicates the spreading function. b1 and b2 are indices of a scale called the Bark scale. More specifically, b1 indicates an index of a signal itself which effects spreading, and b2 indicates a Bark value of a signal influenced by b1.

The spreading function is based on the Bark scale. Therefore, frequency values of respective frequency samples have to be converted into Bark values. For example, this conversion can use:

$$Bark = 13 \arctan(0.76f/1000) + 3.5 \arctan((f/7500)2) \quad (5)$$

where f is a frequency (Hz). For example, when an input signal having a sampling frequency of 48 kHz is converted into a frequency domain by 2048-point FFT, f=48000/2048×i (Hz).

For the sake of convenience, a Bark value corresponding to a sampling frequency index j will be described as bark[j].

Using the values calculated by the aforementioned processing, the masking characteristics of the input signals are calculated by:

$$noise\_thr[j] = \sum_{l=0}^{l=N} in\_noise\_spec\_power[l] \times sprdngf(bark[l], bark[j]) \quad (6)$$

where noise_thr[j] is a masking threshold at a frequency index j of the ambient noise PCM signal. N is the number of FFT points. noise_spec_power[l] indicates a power of the frequency-converted ambient noise PCM signal, and is calculated by:

$$noise\_spec\_power[l] =$$
$$noise\_spec\_r[l] \times noise\_sepc\_r[l] + noise\_sepc\_i[l] \times noise\_spec\_i[l]$$

The masking analysis module 402 sends masking characteristics noise_thr[j] of noise calculated by the aforementioned processing to the sound quality enhancement processor 500.

The sound quality enhancement processor 500 includes a valid channel separation module 501, time/frequency conversion module 502, valid frequency component separation module 503, gain calculation module 504, correction module 505, frequency component combining module 506, frequency/time conversion module 507, and channel combining module 508.

The valid channel separation module 501 outputs intact input signals in[k][i] of respective channels determined as valid channels to the subsequent time/frequency conversion module 502 based on the valid channel information sent from the sound quality enhancement processing controller 200. Also, the valid channel separation module 501 converts input signals in[k][i] of channels determined as invalid channels into sum signals (in_M[k][i]) and difference signals (in_S[k][i]) using, for example, equation (7) below, outputs the sum signals as valid channels to the subsequent time/frequency conversion module 502, and outputs the difference signals as invalid channels to the channel combining module 508.

More specifically, for example, when the system load level sys_load_level=2, channels having channel importance level information values=2 or more are valid channels. Therefore, in this case, as for channels having a channel importance level information value=1, input signals in[k][i] are converted into sum signals and difference signals. For example, in order to convert channel importance level information R(k1, k2)=2(1, 2), equation (7) below is used:

$$in\_M_{12}[i] = \frac{in[1][i] + in[2][i]}{2} \quad (7)$$

$$in\_S_{12}[i] = \frac{in[1][i] - in[2][i]}{2}$$

The time/frequency conversion module 502 converts the input signals in[k][i] of valid channels sent from the valid channel separation module 501 into signals of the frequency domain, and outputs them to the valid frequency component separation module 503. More specifically, this conversion uses, for example, FFT or MDCT.

In the subsequent processing, common algorithms are applied to the input signals in[k][i] of valid channels sent from the valid channel separation module 501 to the time/frequency conversion module 502. Therefore, a real number part of a signal converted into the frequency domain will be described as in_spec_r[i] and an imaginary number part will be described as in_spec_i[i].

The valid frequency component separation module 503 separates the real number parts in_spec_r[i] and imaginary number parts in_spec_i[i] of the signals converted into the frequency domain, which are sent from the time/frequency conversion module 502, into valid and invalid frequency components based on the valid processing frequency band information sent from the sound quality enhancement processing controller 200. Then, the valid frequency component separation module 503 sends valid frequency components to the gain calculation module 504 and correction module 505, and sends invalid frequency components to the frequency component combining module 506.

More specifically, for example, when a frequency importance level F(k, sfb)=3(1, 30) for a signal in_spec{i} converted into the frequency domain, frequency components less than in_spec[sfb idx[30]] are set as valid frequency components, and components greater than or equal to in_spec[sfb idx[30]] are set as invalid frequency components.

Assume that as sfb idx[ ], the scale factor bands set by the valid frequency analysis module 103 of the sound quality estimation module 100 are used.

The gain calculation module 504 calculates gains gain[j] to be multiplied by valid frequency components in_spec_r[j]

and in_spec_i[j] according to ratios of the masking characteristics noise_thr[j] of noise sent from the ambient noise analysis module 400 and the valid frequency components in_spec_r[j] and in_spec_i[j] sent from the valid frequency component separation module 503. More specifically, the gain calculation module 504 calculates a gain, for example, using:

$$\text{gain}[j] = \max\left(1, W \cdot \sqrt{\frac{\text{noise\_thr}[j]}{\text{in\_spec\_r}[j] \times \text{in\_spec\_r}[j] + \text{in\_spec\_i}[j] \times \text{in\_spec\_i}[j]}}\right) \quad (8)$$

where W is a constant greater than or equal to 1. max(a, b) is a function which returns a larger value of a and b.

The correction module 505 multiplies the valid frequency components in_spec_r[j] and in_spec_i[i] sent from the valid frequency separation module 503 by the gains gain[j] calculated by the gain calculation module 504.

$$\text{in\_spec\_}r[j] = \text{gain}[j] \times \text{in\_spec\_}r[j]$$

$$\text{in\_spec\_}i[j] = \text{gain}[j] \times \text{in\_spec\_}i[j] \quad (9)$$

With this processing by the correction module 505, since signals buried in ambient noise can be effectively amplified for respective frequency bands, a clear voice can be played back and output even in a noisy environment with large ambient noise. This correction module 505 outputs the signals multiplied by the gains gain[j] to the frequency component combining module 506.

The frequency component combining module 506 combines the valid frequency components amplified by the correction module 505 and the invalid frequency components output from the valid frequency component separation module 503, and outputs them to the frequency/time conversion module 507.

The frequency/time conversion module 507 converts the signals output from the frequency component combining module 506 into signals of the time domain, and sends them to the channel combining module 508.

The channel combining module 508 combines the signals converted into the time domain by the frequency/time conversion module 507 and invalid channel signals output from the valid channel separation module 501. In this case, the invalid channel signals are difference components in_S[k][i] converted by the valid channel separation module 501 using, for example, equation (7).

More specifically, the channel conversion module 508 converts the difference components in_S[k][i] into respective channel signals in'[k1][i] and in'[k2][i], for example, using:

$$\text{out}[1][i] = \text{in\_}M_{12}[i] + \text{in\_}S_{12}[i]$$

$$\text{out}[2][i] = \text{in\_}M_{12}[i] + \text{in\_}S_{12}[i] \quad (10)$$

As described above, according to this embodiment, the signal correction apparatus which can apply optimal sound clarity enhancement processing according to each individual content quality upon execution of playback processing of input signals associated with content having a wide variety of qualities can be provided.

More specifically, sound qualities of input signals are estimated, importance levels for respective input channels and those for respective frequency bands are determined step by step based on the sound quality estimation result, and valid channels and valid frequency bands to be processed are dynamically switched to be scalable according to the determination result and the system load level. In this manner, a voice having a clear sound quality can be output within the operation restriction of the system including the signal correction apparatus (without exceeding the allowable processing volume on the system) even in an environment suffering ambient noise.

In other words, the sound qualities of input signals are analyzed to adaptively estimate valid channels and valid frequency bands, and only input signals corresponding to the valid channels and valid frequency bands are corrected based on the estimation result, thus implementing correction processing which can achieve both a reduction of the processing volume and a high sound quality.

The present invention has been described based on one embodiment. However, the embodiment is not limited to the aforementioned aspect and, for example, various modifications and applications can be made as follows.

[Modification]

As the processing by the sound quality estimation module 100 and the sound quality enhancement processing by the sound quality enhancement processor 500, for example, various processes shown in FIG. 7 can be executed. FIG. 7 is a schematic block diagram showing an example of the arrangement of a signal correction apparatus according to this modification.

More specifically, as the sound quality estimation processing by the sound quality estimation module 100, for example, "frequency characteristic estimation processing", "sampling frequency estimation processing", "noise estimation processing", "tone estimation processing", "dynamic range estimation processing", "speech speed estimation processing", "volume estimation processing", "phase estimation processing", "reverberation estimation processing", and "auditory lateralization estimation processing" can be executed. Then, the sound quality estimation module 100 sends these estimation processing results to the sound quality enhancement processing controller 200.

In correspondence with the aforementioned various estimation processes of the sound quality estimation module 100, the sound quality enhancement processor 500 includes a processing module 515 which executes the following processes. That is, the processing module 515 executes, for the valid frequency components in_spec_r[j] and in_spec_i[i] sent from the valid frequency component separation module 503, "frequency characteristic enhancement processing", "time resolution enhancement processing", "noise enhancement processing", "tone enhancement processing", "dynamic range enhancement processing", "speech speed conversion processing", "volume control processing", "phase correction processing", "reverberation enhancement processing", and "auditory lateralization enhancement processing" based on the estimation results of the sound quality estimation module 100.

Also, as shown in FIG. 7, analysis targets of the ambient noise analysis module 400 include "frequency band", "volume", "loudness", and "masking characteristics" of ambient noise.

As described above, according to this modification, the signal correction apparatus which can provide the same effects as the signal correction apparatus according to the embodiment can be provided. More specifically, according to this modification, the sound qualities of input signals are estimated based on various characteristics of the input signals, channels and frequency bands which are to undergo correction processing are decided based on the estimated sound qualities, and the correction processing of the input signals is executed based on the decision results.

Furthermore, the aforementioned embodiment includes inventions of various stages, and various inventions can be extracted by appropriately combining a plurality of disclosed required constituent elements. For example, even when some required constituent elements are omitted from all required constituent elements described in the embodiment, an arrangement from which the required constituent elements are omitted can be extracted as an invention as long as the problems that have been discussed in the paragraphs of the problems to be solved by the invention, and the effects that have been explained in the paragraphs of the effect of the invention can be obtained.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A signal correction apparatus comprising:
a sound quality estimation module with channels configured to receive signals, configured to generate channel importance information indicative of importance levels of the channels based on correlations of the signals, and to generate frequency importance information indicative of importance levels of frequency components of the signals according to noise levels of the frequency components;
a sound quality enhancement controller configured to detect a valid channel based on the channel importance information and a valid frequency component based on the frequency importance information, and to generate valid channel information indicative of the valid channel and valid frequency information indicative of the valid frequency component; and
a sound quality enhancement processor configured to enhance sound quality of the valid frequency component of a signal which is received through the valid channel, based on the valid channel information and the valid frequency information,
wherein the sound quality estimation module is configured to perform correlation analysis between two channels in order to generate a similarity, and to generate the channel importance information indicating importance levels of the two channels wherein the importance levels of the two channels are lower than a threshold level when the similarity is higher than a threshold similarity.

2. The apparatus of claim 1, further comprising:
a system load estimation module configured to detect a resource of a system including the signal correction apparatus, the resource being available for the signal correction apparatus, and wherein
the sound quality enhancement controller is further configured to detect the valid channel and the valid frequency component based on the resource detected by the system load estimation module.

3. The apparatus of claim 1, wherein the sound quality estimation module is further configured to determine degrees of flatness of signal spectrums for the frequency components, and to generate the frequency importance information indicative of an importance level of a frequency component, wherein the frequency importance level for the frequency component is lower than a threshold level when the degree of flatness is larger than a threshold degree.

4. The apparatus of claim 1, wherein the sound quality estimation module is further configured to detect a lost frequency component, and to generate the channel importance information indicative of an importance level of the lost frequency component, wherein the frequency importance level for the lost frequency component is a lowest level.

5. The apparatus of claim 1, wherein the sound quality enhancement processor is further configured to convert a signal received through a channel with a channel importance level lower than a threshold level into a sum signal and a difference signal, and to enhance sound quality of the sum signal, and wherein sound quality of the difference signal is not enhanced.

6. The apparatus of claim 1, further comprising:
an ambient noise analysis module configured to calculate masking characteristics caused by ambient noise by receiving ambient noise of the signal correction apparatus,
wherein the sound quality enhancement processor is further configured to adjust gain of the valid frequency component of a signal received through the valid channel based on the masking characteristics.

7. A signal correction method comprising:
generating channel importance information indicative of importance levels of channels for receiving signals based on correlations of the signals;
generating frequency importance information indicative of importance levels of frequency components of the signals based on noise levels of the frequency components;
detecting a valid channel based on the channel importance information and a valid frequency component based on the frequency importance information;
generating valid channel information indicative of the valid channel;
generating valid frequency information indicative of the valid frequency component; and
enhancing sound quality of the valid frequency component of a signal received through the valid channel, based on the valid channel information and the valid frequency information,
performing correlation analysis between two channels in order to generate a similarity;
generating the channel importance information indicating importance levels of the two channels wherein the importance levels of the two channels are lower than a threshold level when the similarity is higher than a threshold similarity.

8. The method of claim 7, further comprising:
detecting a resource of a system implementing the signal correction method, the resource being available for the signal correction method;
detecting the valid channel and the valid frequency component based on the detected resource.

9. The method of claim 7, further comprising:
determining degrees of flatness of signal spectrums for the frequency components;
generating the frequency importance information indicative of an importance level of a frequency component, wherein the frequency importance level for the frequency component is lower than a threshold level when the degree of flatness is larger than a threshold degree.

10. The method of claim 7, further comprising:
detecting a lost frequency component; and
generating the channel importance information indicative of an importance level of the lost frequency component,
wherein the frequency importance level for the lost frequency component is a lowest level.

11. The method of claim 7, further comprising:
converting a signal received through a channel with a channel importance level lower than a threshold level into a sum signal and a difference signal; and
enhancing sound quality of the sum signal,
wherein sound quality of the difference signal is not enhanced.

12. The method of claim 7, further comprising:
calculating masking characteristics caused by ambient noise by receiving ambient noise; and
adjusting gain of the valid frequency component of a signal received through the valid channel based on the masking characteristics.

* * * * *